United States Patent [19]
Slade

[11] Patent Number: 6,072,315
[45] Date of Patent: Jun. 6, 2000

[54] MAGNETIC FIELD PULSE GENERATOR

[75] Inventor: Robert Andrew Slade, Oxon, United Kingdom

[73] Assignee: Oxford Instruments (UK) Limited, Eynsham, United Kingdom

[21] Appl. No.: 08/905,369

[22] Filed: Aug. 4, 1997

[30] Foreign Application Priority Data

Aug. 6, 1996 [GB] United Kingdom ............... 9616499

[51] Int. Cl.⁷ .................................................. G01V 3/00
[52] U.S. Cl. ........................................ 324/322; 324/303
[58] Field of Search ................................ 324/322, 318, 324/314, 307, 309, 312, 300, 303

[56] References Cited

U.S. PATENT DOCUMENTS

| | | | |
|---|---|---|---|
| 4,733,342 | 3/1988 | Mueller et al. | 324/322 |
| 4,820,986 | 4/1989 | Mansfield et al. | 324/322 |
| 5,285,161 | 2/1994 | Rzedian et al. | 324/322 |

FOREIGN PATENT DOCUMENTS 0212760  4/1987  European Pat. Off. .
0357141  7/1990  European Pat. Off. .

OTHER PUBLICATIONS

M. Sauzade et al., "Simulation and Test of a Slice Profile for N.M.R. Imaging System", pp. 1139–1141, Proceeding of the Annual Conference of the IEEE/Engineering in Medicine and Biology Society, Nov. 7–10, 1986.

*Primary Examiner*—Louis Arana
*Attorney, Agent, or Firm*—Price Gess & Ubell

[57] ABSTRACT

An rf magnetic field pulse generator for generating a pulse train comprising a plurality of rf magnetic field pulses for use in an NMR investigation, the generator comprising (i) an amplifier (5) for generating an rf signal, the amplifier having an input for receiving a supply voltage;

(ii) a transmitter coil (42) connected to an output of the amplifier, the transmitter coil being adapted to transmit the rf magnetic field pulses in response to the rf signal;

(iii) a switched voltage regulator (4) for regulating the supply voltage by charging a local storage capacitor; and (iv) a controller (13) for causing the switched voltage regulator to charge the local storage capacitor only when a magnetic field pulse is not being transmitted.

26 Claims, 5 Drawing Sheets

6,072,315

MAGNETIC FIELD PULSE GENERATOR

FIELD OF THE INVENTION

The present invention relates to a magnetic field pulse generator, in particular for generating an rf pulse for use in a nuclear magnetic resonance (NMR) investigation. The invention is particularly concerned with providing such a generator for use in a down-hole oil well logging application.

DESCRIPTION OF THE PRIOR ART

A conventional NMR logging tool uses very high power RF magnetic pulses (several kW) due to the physics of external NMR. The amount of power that can be fed from the surface is limited by the cable's voltage and current capability, and losses in the cable, to less than 500 W.

It is therefore necessary to store energy at the tool, using a capacitor bank. This energy is then used during a pulse sequence (or pulse train), which will typically comprise several hundred individual high power rf pulses, each approximately 60 $\mu$s spaced a few ms apart. The bank is recharged between pulse trains (during the "recycle time", typically a second).

A transmitter power amplifier is described in International Patent Application No. WO97/13159. The rf peak pulse power is determined by the DC voltage applied to the amplifier's H-bridge. If the energy storage module is simply attached to the H-bridge, a problem will occur when the rate of depletion of stored energy exceeds the rate of renewal from the surface. This occurs when the pulse repetition rate is fast (equivalent to short inter-echo time). As the voltage on the storage capacitors drops (as the energy bank is depleted), subsequent pulses in an individual pulse train have less energy (i.e. their amplitude is reduced). This is a phenomenon known as "pulse droop" and will adversely affect the re-focusing of the spin system.

SUMMARY OF THE INVENTION

In accordance with a first aspect of the present invention there is provided an rf magnetic field pulse generator for generating a pulse train comprising a plurality of rf magnetic field pulses for use in an NMR investigation, the generator comprising (i) an amplifier for generating an rf signal, the amplifier having an input for receiving a supply voltage;

(ii) a transmitter coil connected to an output of the amplifier, the transmitter coil being adapted to transmit the rf magnetic field pulses in response to the rf signal;

(iii) a switched voltage regulator for regulating the supply voltage by charging a local storage capacitor; and (iv) a controller for causing the switched voltage regulator to charge the local storage capacitor only when a magnetic field pulse is not being transmitted.

It has been found that the energy of the pulses in a pulse train can be maintained by controlling the pulse amplitude, using a suitable switched voltage regulator. This ensures that the amplitude of the pulses is substantially identical.

Typically the supply voltage is a DC supply voltage.

The voltage regulator charges the local storage capacitor in synchronism with the pulse train, such that the local storage capacitor is not charged during a pulse. This can be contrasted with conventional switched voltage regulators in which the voltage regulator is switched independently.

The switched voltage regulator is preferably also adapted such that the local storage capacitor is not charged when an NMR echo is being acquired. This ensures that the small NMR echo signal can be received clearly without any interference from the charging of the local storage capacitor.

The local storage capacitor may be charged before and/or after the NMR echo. Preferably however the switched voltage regulator is adapted to charge the local storage capacitor during the pulse train only between receiving an echo and transmitting the next pulse in the pulse train. This ensures that the receiver system is not re-excited by the activity of the pulse droop regulator circuit during the "ring-down" period after the high power rf pulse.

Preferably the switched voltage regulator is adapted to switch on and off only once between adjacent pulses. This can be contrasted with a conventional switched voltage regulator in which the regulator is switched on and off continuously to recharge the capacitor.

It has been recognised that the problem of pulse droop can more easily be dealt with by using a voltage regulator that ensures that the supply voltage seen by the amplifier does not vary significantly during a pulse train. It will be appreciated that the supply voltage may change during the course of the pulse. However the voltage regulator ensures that the supply voltage is restored to the correct level in time for the next pulse.

The local storage capacitor is preferably sized to hold enough energy for a few typical pulses. The generator typically further comprises an energy store module (typically a capacitor bank) which provides an initial supply voltage. The initial supply voltage (which is typically higher than the amplifier supply voltage) may droop as the capacitor bank discharges during a pulse train, but the voltage regulator ensures that this voltage droop is not passed on to the amplifier.

Typically the voltage regulator comprises means for generating a reference voltage, wherein the voltage regulator is adapted to hold the supply voltage substantially at a level linearly proportional to that of the reference voltage. The reference voltage is typically in the range of a few volts, for ease of design, but the supply voltage is typically the order of a few hundred volts. Preferably the generator further comprises means for adjusting the reference voltage whereby the supply voltage can be controlled. This provides the advantage of user control over the pulse amplitude.

An example of a suitable voltage regulator according to the present invention comprises a bucking (or step-down) switching circuit.

Over the time scale of a single pulse, the supply voltage may vary significantly. For example, where the pulses have a duration of approximately 40 $\mu$s, the supply voltage may be boosted in the first 10 $\mu$s of the pulse by a "ring-up" circuit. However, over the time scale of the pulse train (which will typically comprise hundreds of pulses), the amplifier supply voltage will typically remain substantially constant.

Amplifier circuits are broadly categorised into Classes A–E, the definition of each class being dependent on application. The situation is further complicated depending by the type of output load (ie: resistive, reactive, tuned, etc). However, amplifiers can generally be split into two categories: linear (Classes A–C) and switching (Class D/E). In linear amplifiers (Class A/B) the output signal frequency is the same as the input frequency, but the output signal amplitude is linearly proportional to the input signal amplitude (eg: output rms voltage=gain×input rms voltage). With a switching amplifier the output signal also has the same frequency as the input signal but the output amplitude is proportional to the DC supply voltage.

The amplifier typically comprises an amplifier whose output rf power is dependent on its DC supply voltage. An example is a class D/E resonant switching amplifier, such as an H-bridge amplifier as described in WO97/13159. Its output is actually characterised by the Tx coil current (rather than coil voltage), but it is conventional to refer to output power when dealing with rf. The final result is that output rf power is proportional to the square of DC supply voltage (ie: output rms power=gain×supply dc voltage).

Typically the transmitter coil forms part of a tank circuit comprising the transmitter coil and a serially connected tuning capacitor, tuned to the required frequency of operation. Alternatively the tank circuit may comprise a tuning capacitor in parallel with the transmitter coil, connected to the amplifier via a transformer.

The rf magnetic field pulse generator according to the present invention may be employed in any NMR investigation. However, the generator is particularly suited to an NMR investigation in which only a limited power supply is available, due to its high inherent efficiency. Typically the generator according to the present invention is employed as part of a down-hole well logging probe.

The present invention also extends to a method of performing an NMR investigation comprising generating an rf signal at an output of an amplifier; feeding the rf signal to a transmitter coil whereby the transmitter coil transmits a pulse train comprising a plurality of rf magnetic field pulses into a working region subjected to a static magnetic field of controlled characteristics; providing a supply voltage to the amplifier; regulating the supply voltage with a switched voltage regulator comprising a local storage capacitor; and selectively charging the local storage capacitor only when an rf magnetic field pulse is not being transmitted.

The static magnetic field may be substantially homogeneous in the working region, or may exhibit a substantially uniform radial or axial gradient in the working region.

BRIEF DESCRIPTION OF THE DRAWINGS

A number of embodiments of the present invention will now be described with reference to the accompanying Figures, in which.

EMBODIMENT

Figure 1:
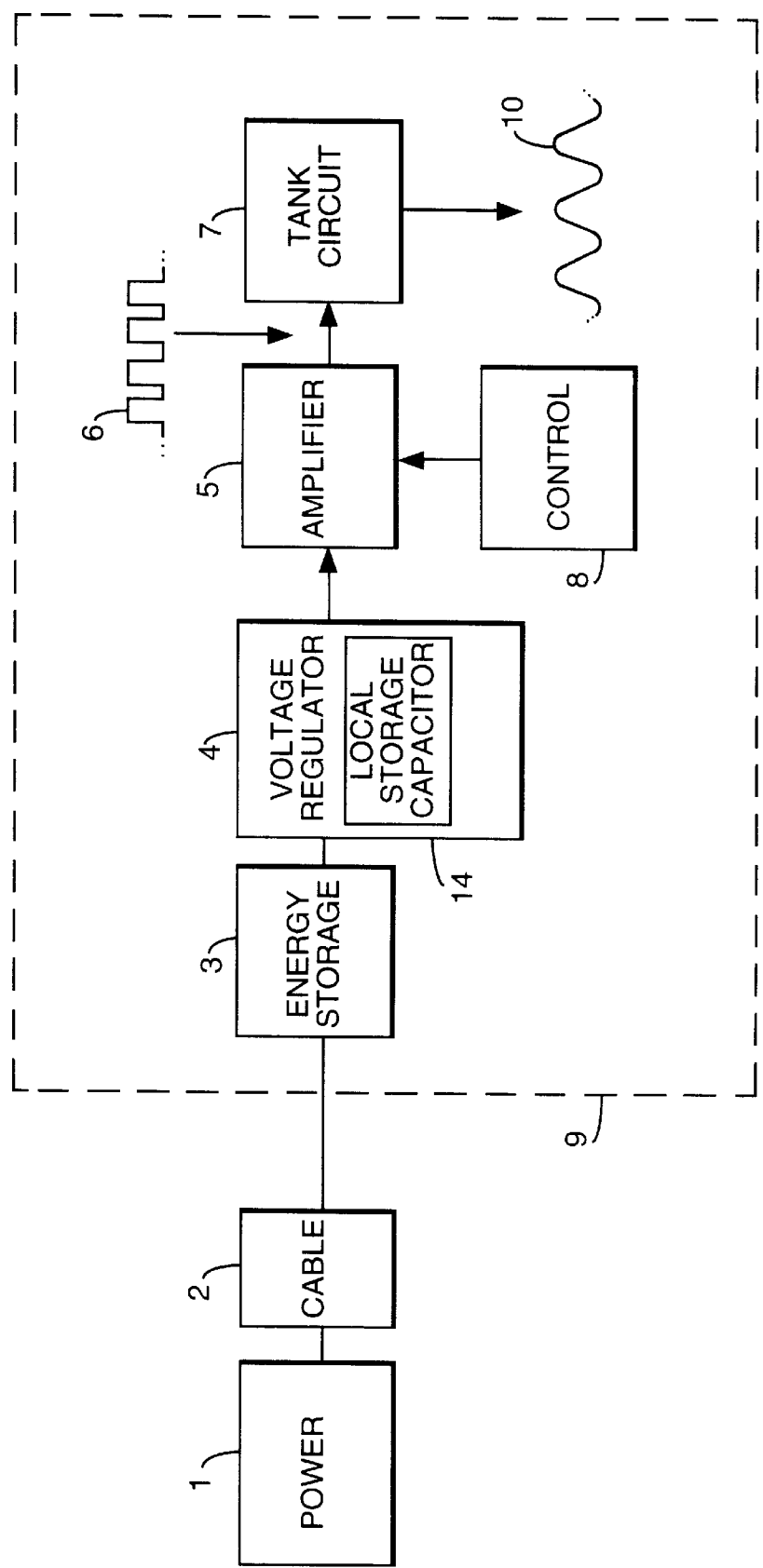
FIG. 1 is a schematic diagram of a down-hole well logging probe incorporating an example of a generator according to the invention.

Referring to the schematic diagram of FIG. 1, surface DC power supply 1 is connected via cable 2 (which passes along the length of a well hole) to a probe 9 incorporating energy storage device 3. The energy storage device 3 is connected to an amplifier 5 via voltage regulator 4 which comprises a local storage capacitor 14. The power amplifier 5 provides a pulsed AC rf signal 6 to tank circuit 7, system operation being controlled by the controlling circuit 8, typically the NMR spectrometer. The amplifier load, in this case a tuned tank circuit 7, comprises a transmitter coil which transmits an rf magnetic signal 10 which is used in an NMR investigation of the environment surrounding the probe 9. An example of the circuit illustrated in FIG. 1 (excluding the voltage regulator 4) is described in WO97/13159 which is incorporated herein by reference.

Figure 2:
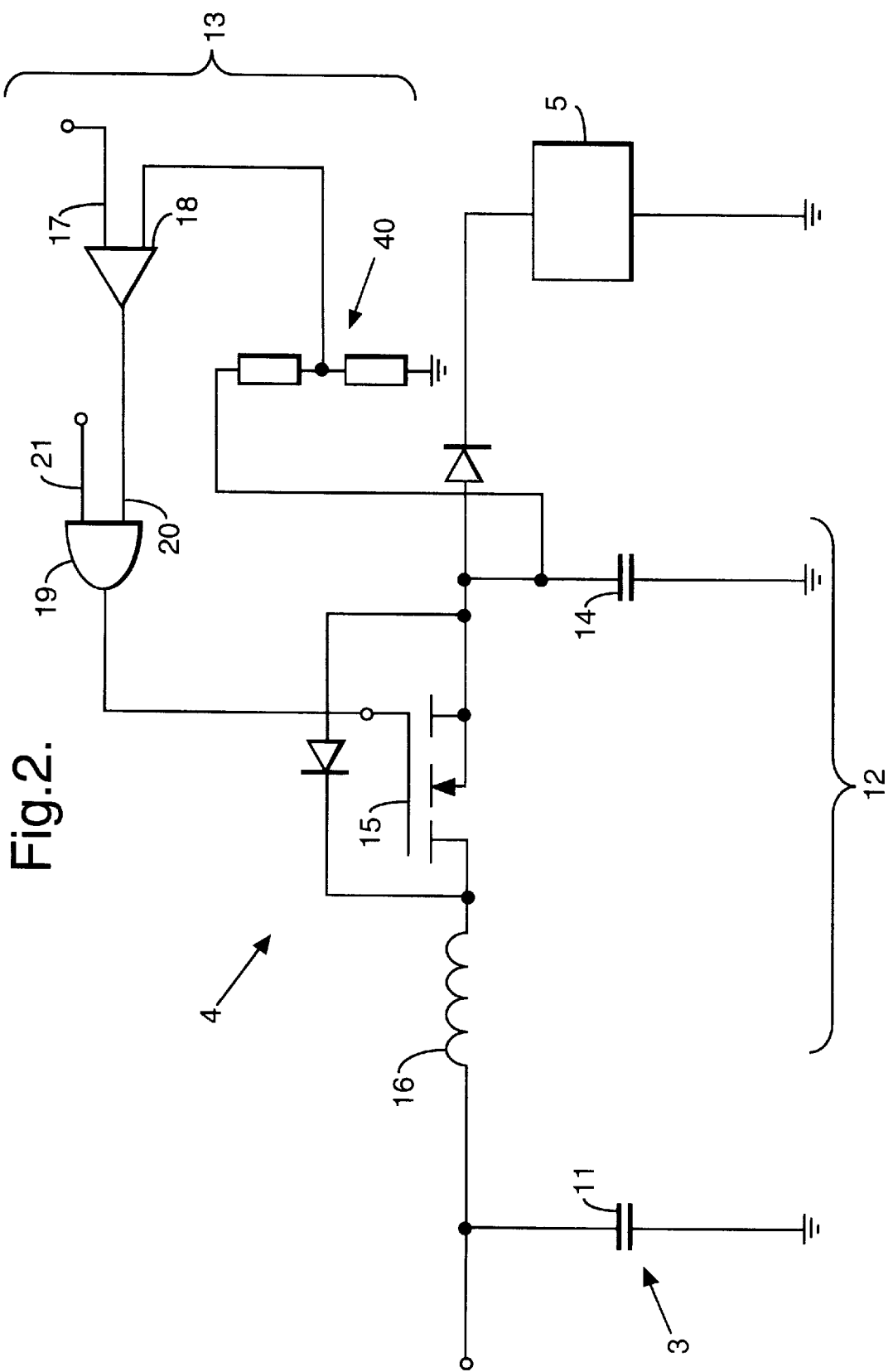
FIG. 2 is a circuit diagram illustrating the voltage regulator of FIG. 1 in detail.

A specific example of the voltage regulator 4 is illustrated in FIG. 2. The voltage regulator (indicated generally at 4) is connected between the main energy storage device 3 comprising a capacitor bank 11 (which is charged via surface cable 2) and amplifier circuit 5 (which is typically an H-bridge as described in WO97/13159). The main storage capacitor bank 11 typically is charged to 500–1000 V and typically stores 250 J of energy. As shown in FIG. 2, the voltage regulator 4 can be conceptually divided into a pulse droop recovery section 12 and control circuit 13. The voltage regulator 4 ensures that the voltage seen by the H-bridge amplifier 5 does not change as the voltage on the capacitor bank 11 drops.

A small local storage capacitor 14 is connected to the main capacitor bank 11 by a solid state switch 15 (which may be a MOSFET switch or IGBT switch) and typically 1–10 mH charging inductor 16. A reference voltage 17 defines the voltage required at the input of H-bridge 5. The reference voltage 17 is a low level voltage (few volts), for ease of design of the control circuit 13, but is linearly related to the higher voltage on the local storage capacitor 14, which is typically 100–500 V, by means of the potential divider 40. Capacitor 14 is large enough so that insignificant droop is seen during the longest likely pulse (about 10–50 $\mu$F when charged to an amplifier operating voltage of about 200 V, for typical rf pulse powers).

Figure 3:
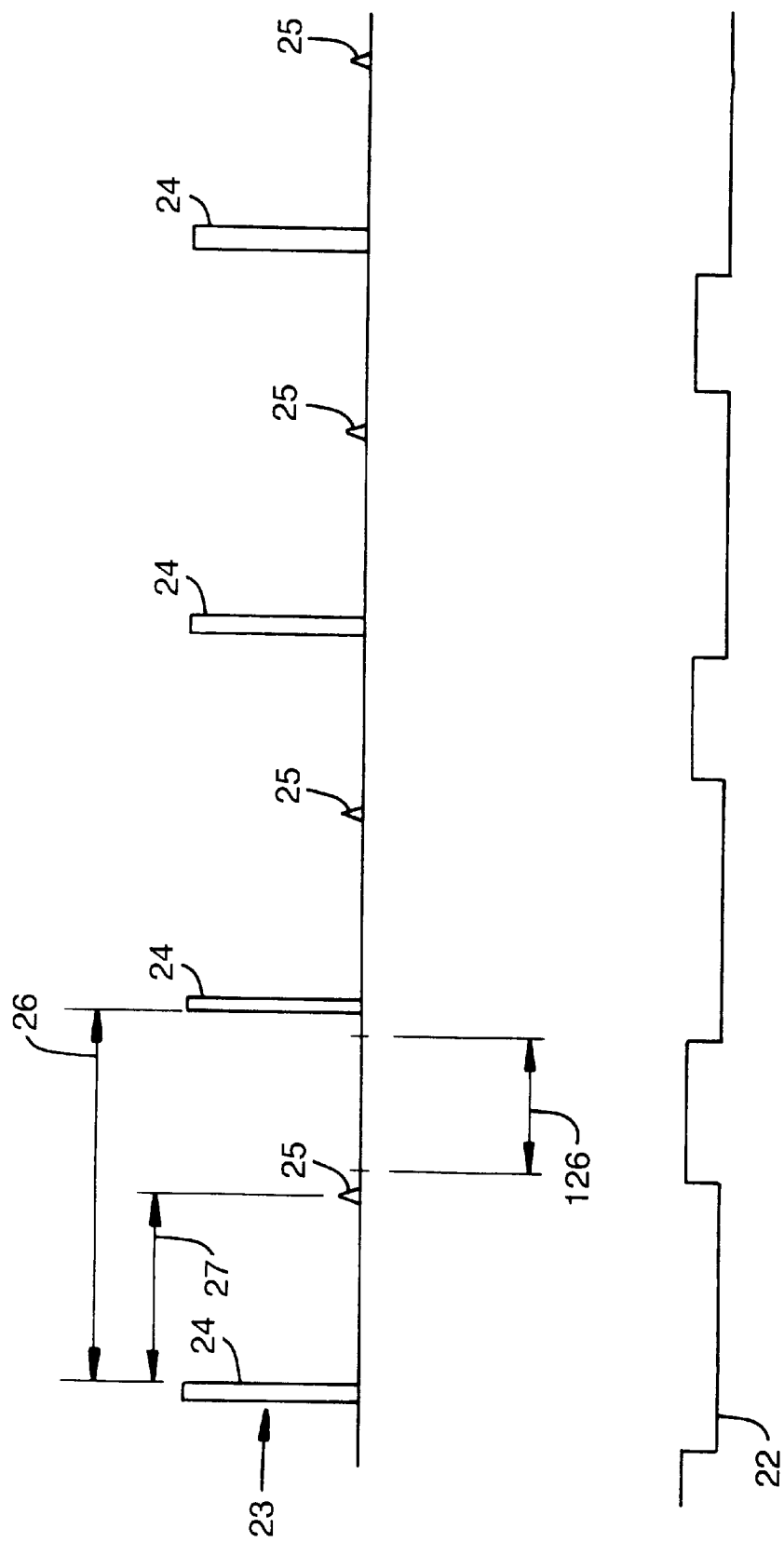
FIG. 3 is a timing diagram illustrating the recharge control signal and a simultaneous pulse train.

The voltage on capacitor 14 is compared to the reference voltage 17 by means of a comparator 18 and potential divider network 40. After a pulse the voltage across capacitor 14 will have dropped relative to the value requested by the reference voltage 17 and a logic error signal is generated by the comparator 18 and input to AND gate 19. Switch 15 is operated by means of AND gate 19 which has a first input 20 connected to the output of comparator 18, and a second input 21 connected to a control circuit (not shown) which generates a recharge enable logic signal as illustrated in FIG. 3. As a result, between pulses the switch 15 is closed and capacitor 14 charges at a rate determined by inductor 16 until the desired voltage is reached. Switch 15 is then opened and capacitor 14 holds the energy for the next pulse.

FIG. 3 is a schematic timing diagram illustrating the recharge logic signal 22 applied to input 21 and rf magnetic pulse sequence 23 which is simultaneously being generated by amplifier 5 and output by tank circuit 7. Spin echo pulse sequence 23 comprises a number of rf pulses 24 which are transmitted by the probe. The pulses 24 are 180° pulses with a pulse duration of the order of 60 $\mu$s. The period 26 between 180° pulses 24 is typically 1 millisecond (ms). Echoes 25 (which are used in a subsequent NMR analysis) are acquired a time period 27 (typically 0.5 ms) after each pulse 24. If the inter-echo time is 2$\tau$, then the echoes 25 always occur a time $\tau$ after the start of the previous pulse; ie: half way between 180° pulses. The recharging operation can only be conducted between pulses 24, and must not coincide with the NMR echo acquisition 25. Therefore the ideal time to recharge is just after the echo 25 has been acquired. The control circuit 13 is enabled during this time by the recharge logic signal 22 which is at a high level during the required time period 126.

The reference voltage 17 can be adjusted by a user to give direct linear control over the pulse amplitude. This is particularly the case where the amplifier 5 is a class D/E amplifier. This gives a useful way of tuning the total pulse energy after the pulse length has been selected. The recharge logic signal 22 can also be controlled by the user to give direct control over the recharge timing.

Figure 4:
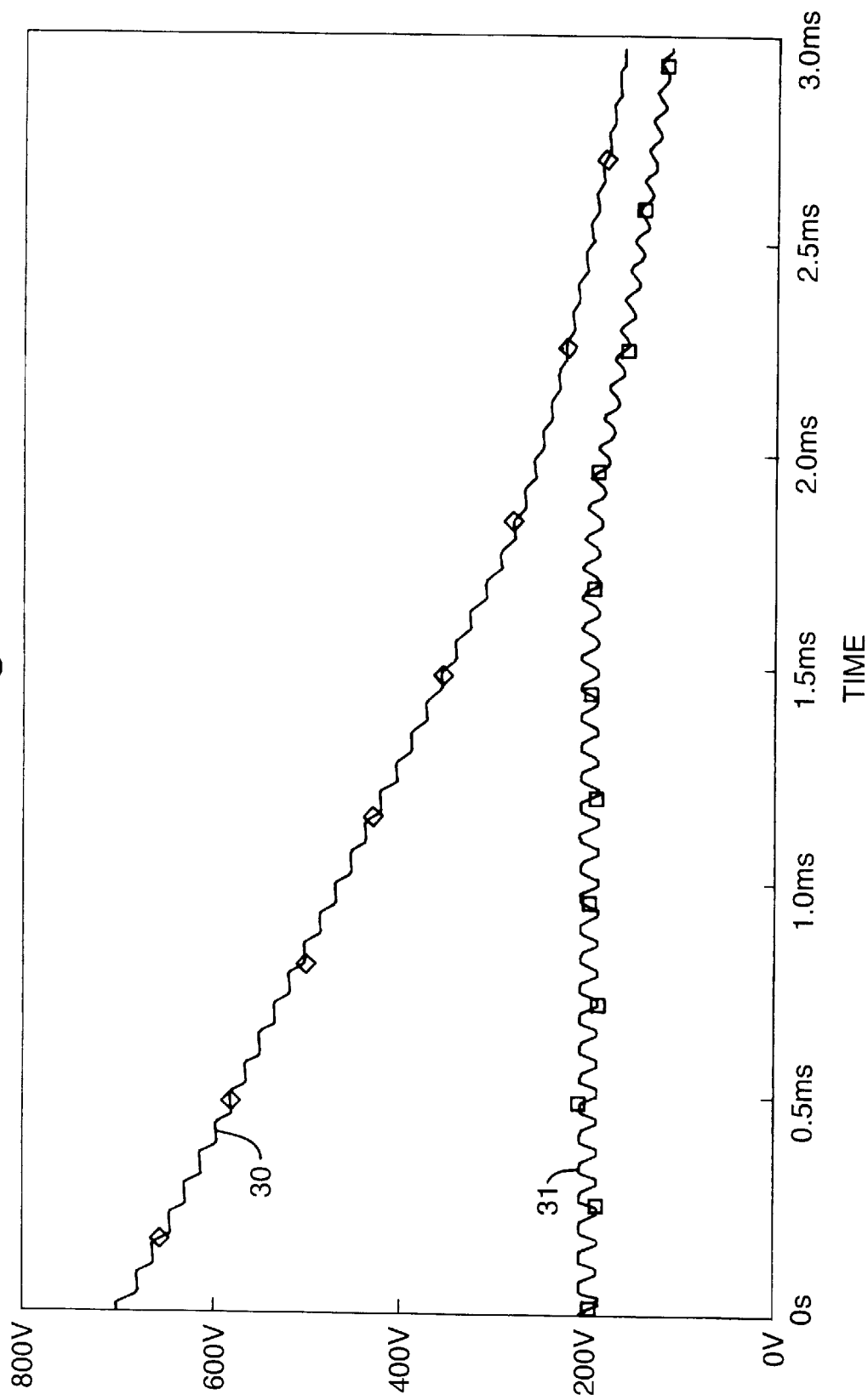
FIG. 4 is a graph of the voltage on test storage capacitors during a test pulse train.

FIG. 4 is a graph illustrating the voltage 30 on the storage capacitor bank 11 and the voltage 31 on the local capacitor 14 during a simulated pulse train. In order to conveniently carry out the simulation to generate the data for FIG. 4 the value of the capacitor 11 has been reduced from 2000 $\mu$F to 50 $\mu$F. Therefore the time scale in FIG. 4 is effectively accelerated for the sake of simulation speed because the much reduced energy stored in capacitor 11 is rapidly dissipated with far fewer pulses than in a real pulse train. After approximately 1.8 ms the voltage 30 on capacitor 11 drops near the desired H-bridge voltage of 200 volts and the regulation beings to fail. In a realistic situation (in which the value of capacitors 11 and 14 are correct), the loss of regulation shown in FIG. 4 will not be experienced over the time scale of a typical pulse train—which will typically last for several hundred milliseconds.

Figure 5:
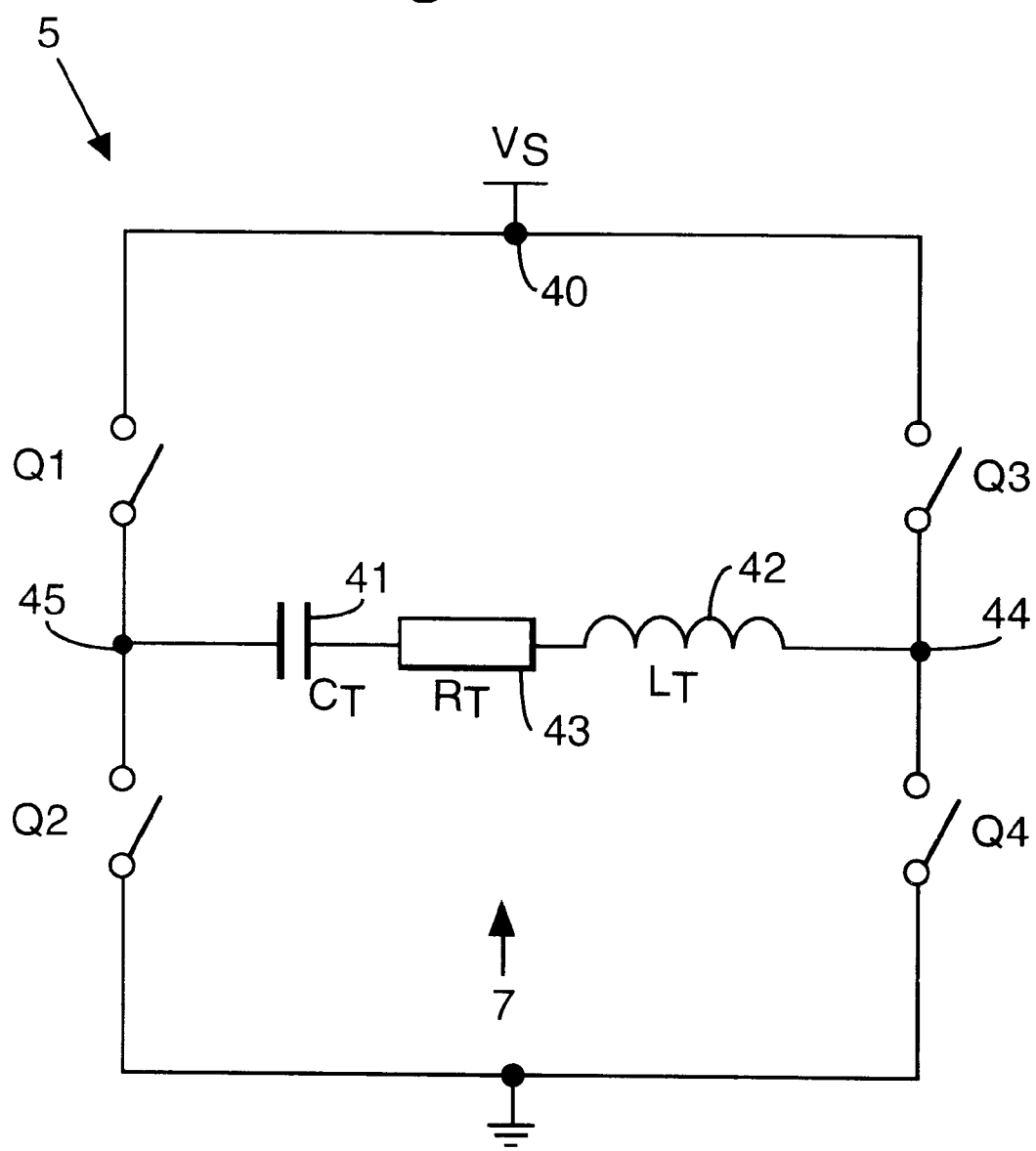
FIG. 5 is a schematic diagram of the H-bridge amplifier.

FIG. 5 is a schematic diagram of a typical transmitter power amplifier which can be used in the circuit of FIG. 1. The amplifier 5 is an H-bridge switch mode resonant converter. The amplifier has an input 40 which receives a DC supply voltage. Tank circuit 7 comprising capacitor 41, and a transmitter coil represented by an inductance 42 and resistance 43 is connected between respective outputs 44,45. Switch pairs Q1–Q4 are switched at the tank circuit resonant frequency $f_0$. A sinusoidal current I flows in the transmitter coil at the frequency $f_0$. The output power of the amplifier is proportional to $V_s^2$ (where $V_s$ is the DC supply voltage); ie:

$$P_{RMS} = \frac{V_s^2}{\sqrt{2} \, R_T}$$

where $R_T$ is the resistance of the $T_x$ coil.

I claim:

1. An rf magnetic field pulse generator for generating a pulse train comprising a plurality of rf magnetic field pulses for use in an NMR investigation, said generator comprising:
   (i) an amplifier for generating an rf signal, said amplifier having an input for receiving a supply voltage;
   (ii) a transmitter coil connected to an output of said amplifier, the transmitter coil being adapted to transmit said rf magnetic field pulses in response to said rf signal;
   (iii) a switched voltage regulator for regulating said supply voltage by charging a local storage capacitor; and
   (iv) a controller for causing said switched voltage regulator to charge said local storage capacitor during the generation of a pulse train, and when one of said rf magnetic field pulses is not being transmitted.

2. A generator according to claim 1 wherein said controller causes said switched voltage regulator to charge said local storage capacitor only when an NMR echo is not being received.

3. A generator according to claim 2 wherein said controller causes said switched voltage regulator to charge said local storage capacitor during said pulse train only between receiving an echo and transmitting the next pulse in said pulse train.

4. A generator according to claim 1 wherein said controller causes said switched voltage regulator to switch on and off only once between adjacent pulses.

5. A generator according to claim 1 wherein said voltage regulator comprises means for generating a reference voltage, wherein said controller is adapted to monitor said supply voltage, to compare said supply voltage with a reference voltage, and to control said voltage regulator to hold said supply voltage substantially at a level linearly related to said reference voltage.

6. A generator according to claim 5 further comprising means for adjusting said reference voltage whereby said supply voltage can be controlled.

7. A generator according to claim 1 wherein said voltage regulator comprises a bucking voltage regulator.

8. A generator according to claim 1 wherein said amplifier is a switching amplifier, with output rf power dependent on its DC supply voltage.

9. NMR inspection apparatus comprising magnetic field generating means for generating a static magnetic field of controlled characteristics in a working region; an rf magnetic field pulse generator for generating a pulse train of rf magnetic field pulses in said working region; and means for sensing NMR echoes from said working region, wherein said rf magnetic field pulse generator comprises:
   (i) an amplifier for generating an rf signal, said amplifier having an input for receiving a supply voltage;
   (ii) a transmitter coil connected to an output of said amplifier, the transmitter coil being adapted to transmit said rf magnetic field pulses in response to said rf signal;
   (iii) a switched voltage regulator for regulating said supply voltage by charging a local storage capacitor; and
   (iv) a controller for causing said switched voltage regulator to charge said local storage capacitor during the generation of a pulse train, and when one of said rf magnetic field pulses is not being transmitted.

10. A down hole well logging or measurement while drilling tool using the inspection apparatus according to claim 9.

11. A method of performing an NMR investigation comprising:
    generating an rf signal at an output of an amplifier; feeding said rf signal to a transmitter coil whereby said transmitter coil transmits a pulse train comprising a plurality of rf magnetic field pulses into a working region subjected to a static magnetic field of controlled characteristics; providing a supply voltage to said amplifier; regulating said supply voltage with a switched voltage regulator comprising a local storage capacitor; and selectively charging said local storage capacitor during the generation of a pulse train, and when one of said rf magnetic field pulses is not being transmitted.

12. A method according to claim 11 further comprising only charging said local storage capacitor when an NMR echo is not being received from said working region.

13. A method according to claim 12 further comprising only charging said local storage capacitor during said pulse train after receipt of an NMR echo from said working region and before the next pulse.

14. An rf magnetic field pulse generator for generating a pulse train comprising a plurality of rf magnetic field pulses for use in an NMR investigation, said generator comprising:
    (i) an amplifier for generating an rf signal, said amplifier having an input for receiving a supply voltage;
    (ii) a transmitter coil connected to an output of said amplifier, the transmitter coil being adapted to transmit said rf magnetic field pulses in response to said rf signal;

(iii) a switched voltage regulator for regulating said supply voltage by charging a local storage capacitor; and (iv) a controller for causing said switched voltage regulator to charge said local storage capacitor during the generation of a pulse train, and when an NMR echo is not being received.

15. A generator according to claim 14 wherein said controller causes said switched voltage regulator to charge said local storage capacitor only when one of said rf magnetic field pulses is not being transmitted.

16. A generator according to claim 15 wherein said controller causes said switched voltage regulator to charge said local storage capacitor during the pulse train only between receiving an echo and transmitting the next pulse in said pulse train.

17. A generator according to claim 14 wherein said controller causes said switched voltage regulator to switch on and off only between adjacent pulses.

18. A generator according to claim 14 wherein said voltage regulator comprises means for generating a reference voltage, wherein said controller is adapted to monitor the supply voltage, to compare the supply voltage with a reference voltage, and to control the voltage regulator to hold said supply voltage substantially at a level linearly related to the reference voltage.

19. A generator according to claim 18 further comprising means for adjusting said reference voltage whereby said supply voltage can be controlled.

20. A generator according to claim 14 wherein said voltage regulator comprises a bucking voltage regulator.

21. A generator according to claim 14 wherein said amplifier is a switching amplifier, with output rf power dependent on its DC supply voltage.

22. NMR inspection apparatus comprising magnetic field generating means for generating a static magnetic field of controlled characteristics in a working region; an rf magnetic field pulse generator for generating a pulse train of rf magnetic field pulses in said working region; and means for sensing NMR echoes from said working region, wherein said rf magnetic field pulse generator comprises:

(i) an amplifier for generating an rf signal, said amplifier having an input for receiving a supply voltage;

(ii) a transmitter coil connected to an output of said amplifier, the transmitter coil being adapted to transmit said rf magnetic field pulses in response to said rf signal;

(iii) a switched voltage regulator for regulating said supply voltage by charging a local storage capacitor; and (iv) a controller for causing said switched voltage regulator to charge said local storage capacitor during the generation of a pulse train, and when an NMR echo is not being received.

23. A down hole well logging or measurement while drilling tool using the inspection apparatus according to claim 22.

24. A method of performing an NMR investigation comprising:

generating an rf signal at an output of an amplifier; feeding said rf signal to a transmitter coil whereby said transmitter coil transmits a pulse train comprising a plurality of rf magnetic field pulses into a working region subjected to a static magnetic field of controlled characteristics; providing a supply voltage to said amplifier; regulating said supply voltage with a switched voltage regulator comprising a local storage capacitor; and selectively charging said local storage capacitor during the generation of a pulse train, and when an NMR echo is not being received.

25. A method according to claim 24 further comprising charging said local storage capacitor only when one of said rf magnetic field pulses is not being transmitted.

26. A method according to claim 24 further comprising only charging the local storage capacitor during said pulse train after receipt of an NMR echo from said working region and before the next pulse.

* * * * *